US 12,105,124 B2

(12) United States Patent
Chang et al.

(10) Patent No.: US 12,105,124 B2
(45) Date of Patent: Oct. 1, 2024

(54) SYSTEM AND METHOD FOR CONSTANT TRANSCONDUCTANCE BASED POWER SUPPLY DETECTION

(71) Applicant: Taiwan Semiconductor Manufacturing Company, Ltd., Hsinchu (TW)

(72) Inventors: Yen-An Chang, Miaoli County (TW); Yi-Chun Shih, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 136 days.

(21) Appl. No.: 17/879,477

(22) Filed: Aug. 2, 2022

(65) Prior Publication Data

US 2024/0044955 A1    Feb. 8, 2024

(51) Int. Cl.
*G01R 21/06*      (2006.01)
*H01L 21/20*      (2006.01)
*H03K 5/24*       (2006.01)

(52) U.S. Cl.
CPC .............. *G01R 21/06* (2013.01); *H03K 5/24* (2013.01)

(58) Field of Classification Search
CPC ........ H01L 21/02565; G01R 19/16538; G01R 19/16571
See application file for complete search history.

(56) References Cited

U.S. PATENT DOCUMENTS 6,452,414 B1 *   9/2002   Lorenz ............. G01R 19/16547
                                                        324/76.11

2006/0082395 A1    4/2006   Fukushi et al.
(Continued)

FOREIGN PATENT DOCUMENTS

| CN | 101588164 B | 11/2009 |
| CN | 106257836 B | 12/2016 |
| JP |   4497742 A |  7/2010 |

OTHER PUBLICATIONS

Office Action issued in connection with Taiwan Appl. No. 112124298 dated Feb. 22, 2024.

*Primary Examiner* — Jermele M Hollington
*Assistant Examiner* — Temilade S Rhodes-Vivour
(74) *Attorney, Agent, or Firm* — FOLEY & LARDNER LLP

(57) ABSTRACT

In some aspects of the present disclosure, a power detection system is disclosed. In some aspects, the power detection system includes a constant-transconductance (gm) reference generator circuit receiving a power supply voltage. In some embodiments, the constant-gm reference generator circuit includes a first current mirror to provide a first reference voltage and a second current mirror to provide a second reference voltage. In some embodiments, the constant-gm reference generator circuit includes a power detection circuit coupled to the first current mirror to receive the first reference voltage. In some embodiments, the power detection circuit is coupled to the second current mirror to receive the second reference voltage. In some embodiments, the power detection is operated to receive the power supply voltage. In some embodiments, the power detection circuit is operated to provide an output voltage having one of two logic states at least based on the second reference voltage and the power supply voltage.

17 Claims, 9 Drawing Sheets

(56) References Cited

U.S. PATENT DOCUMENTS

| | | | |
|---|---|---|---|
| 2009/0284300 A1* | 11/2009 | Meyer | G01R 19/02 |
| | | | 327/348 |
| 2012/0153921 A1* | 6/2012 | Brokaw | H02M 3/156 |
| | | | 323/288 |
| 2019/0074827 A1* | 3/2019 | Norling | H03K 17/168 |
| 2021/0003619 A1* | 1/2021 | Lo Muzzo | H03F 1/22 |
| 2023/0083084 A1* | 3/2023 | Golara | G11C 5/147 |
| | | | 365/189.09 |

* cited by examiner

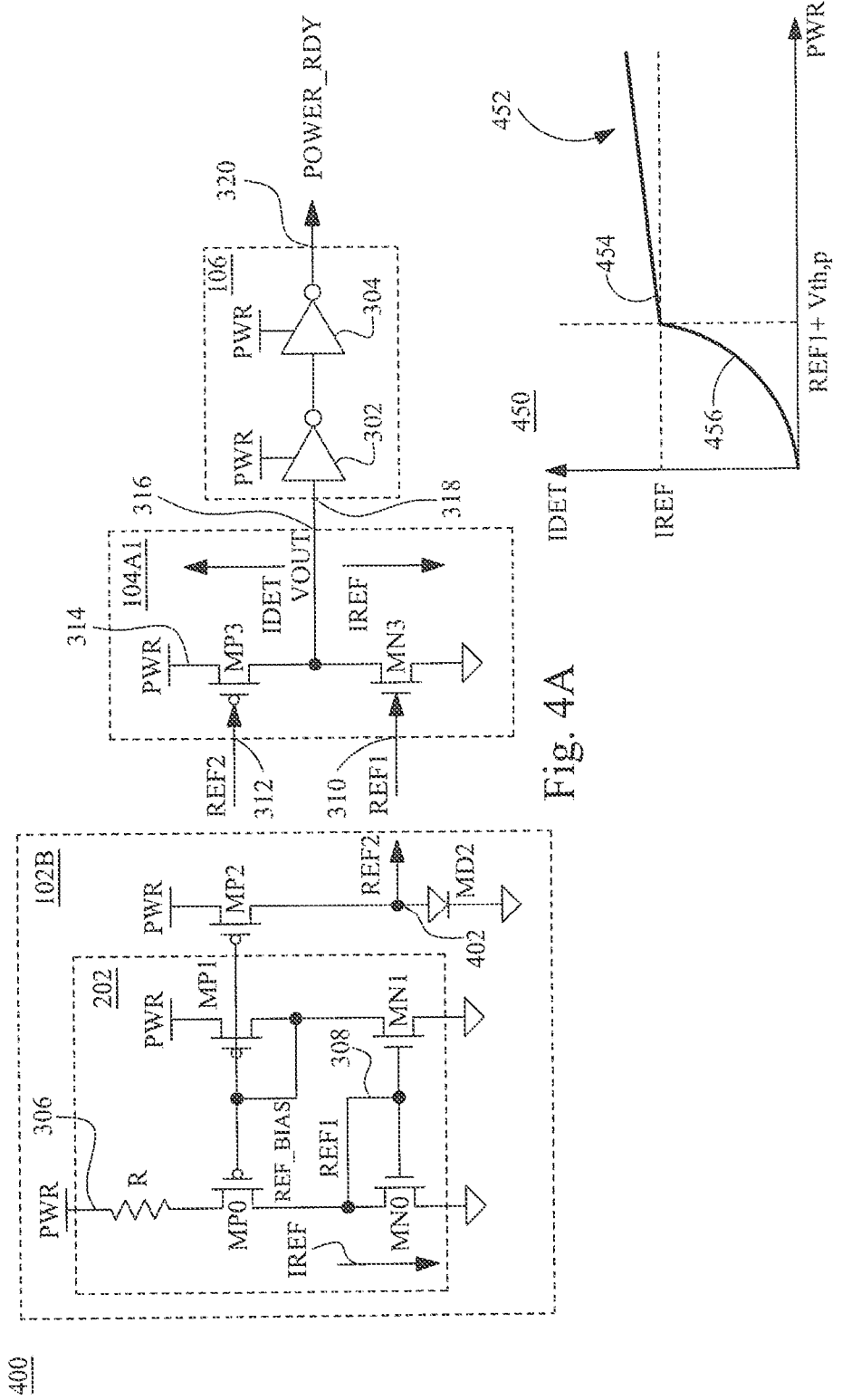

SYSTEM AND METHOD FOR CONSTANT TRANSCONDUCTANCE BASED POWER SUPPLY DETECTION

BACKGROUND

An ability for an electronic device to reset itself in case of error or abnormal power loss is an aspect of embedded system design and programming. This ability can be observed with everyday electronics such as a television, audio equipment or the electronics of a car, which can function as intended after having lost power suddenly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A illustrates a block diagram of a multi-reference power detection system, in accordance with some embodiments of the present disclosure.

FIG. 4B illustrates a plot of a current-voltage (IV) curve for a power detection circuit of FIG. 4A, in accordance with some embodiments of the present disclosure.

DETAILED DESCRIPTION

Figure 1:
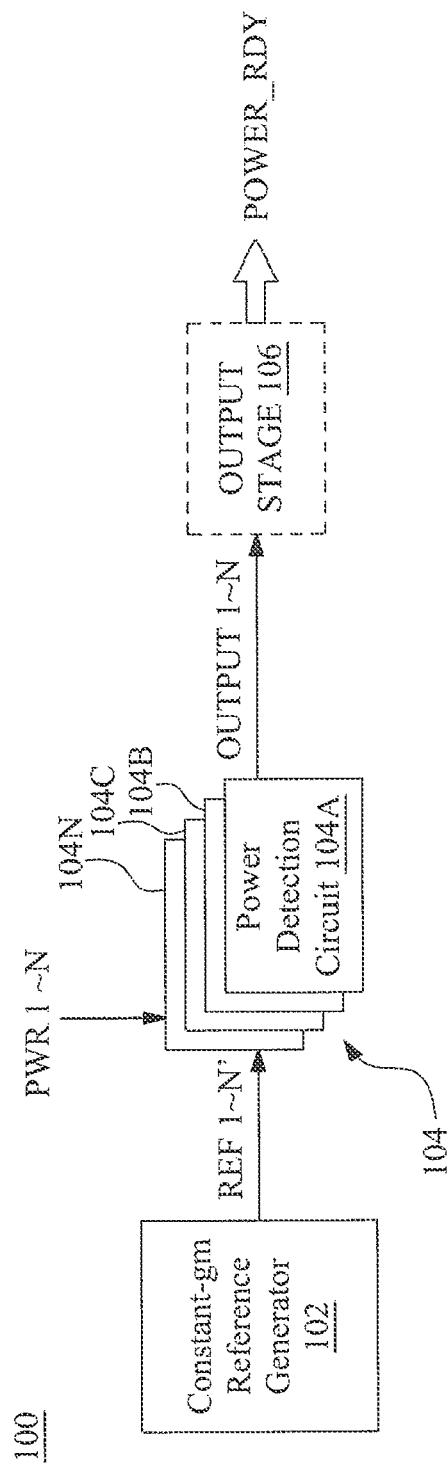
FIG. 1 illustrates a block diagram of a power detection system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a system on a chip (SoC), power rails for memory, logic, and input/output (IO) units can be separated. This can be because memory circuits, logic, and I/O circuits can have different voltage requirements. However, power loss in a first power domain can induce a circuit in the first power domain such as an I/O power domain to generate a floating or unknown signal that is sent to the second power domain such as a memory power domain. A circuit in the second power domain that receives the floating or unknown signal can have an unknown signal at the output or result in a circuit or device being mis-programmed. Moreover, the floating or the unknown signal can damage a semiconductor device. In addition, the floating or unknown signal can cause DC leakage in the circuit in the second power domain. Power loss in a first power domain may be referred to as an abnormal loss. For some embedded memory systems, a detection circuit may be needed to reset a memory system when an abnormal loss or an abnormal power on/off sequence occurs.

The present disclosure provides various embodiments of a constant-transconductance (gm) power detection system that can generate a number of reference voltages for detecting power of a number of power domains. Embodiments of the constant-gm power detection system provide a power ready signal that indicates whether the power of all the power domains is detected. Embodiments of the constant-gm power detection system can be used for multi-power-domains memories, such as magnetoresistive random-access memory (MRAM), resistive RAM (RRAM), and flash, and multi-voltage domain circuit systems. Advantageously, embodiments of the constant-gm power detection system can reset memory systems and/or peripheral circuits when an abnormal power loss or an abnormal power on/off sequence occurs. In addition, embodiments of the constant-gm power detection system offer low-power, low-area, accurate detection to meet embedded memory requirements. For example, embodiments of the constant-gm power detection system can achieve sub-microamp (uA) current consumption. In another example, embodiments of the constant-gm power detection system can achieve lower current consumption within a smaller area than a comparable power detection system using a bandgap voltage reference.

FIG. 1 illustrates a block diagram of a power detection system 100, in accordance with some embodiments of the present disclosure. The power detection system 100 includes a constant-transconductance (gm) reference generator 102. A gm can be defined as a ratio of a current at an output of a device and a voltage at an input of the device. The power detection system 100 is adapted to provide one or more reference voltages that bias transistors such that the transistors have a constant gm, or substantially constant gm, across any condition such as transistor process, power supply voltage, and operating temperature. The conditions of transistor process, power supply voltage, and operating temperature may be collectively referred to as process-voltage-temperature (PVT). In some embodiments, the constant-gm reference generator 102 provides one or more reference currents or any of other various reference signals while remaining within the scope of the present disclosure.

The power detection system 100 can include a number of power detection circuits 104 adapted to detect whether a respective number of power domains or voltage domains are enabled. In some embodiments, each power detector corresponds to a power domain or voltage domain. The number of power detection circuits 104 are coupled to the constant-gm reference generator 102. As shown in FIG. 1, the power detection system 100 includes the power detection circuits 104A, 104B, 104C, and 104N. The number of power detection circuits 104 can include greater than or less than four power detection circuits while remaining in the scope of the present disclosure. For example, in some embodiments, the number of power detection circuits 104 can include one power detection circuit, two power detection circuits, 10 power detection circuits, or any other number of power detection circuits that is suitable for a memory with one or more power domains or voltage domains.

In some embodiments, each power detection circuit of the number of power detection circuits 104 receives a corresponding reference voltage from the constant-gm reference generator 102. For example, the power detection circuit 104A receives a reference voltage REF1, the power detection circuit 104B receives a reference voltage REF2, the power detection circuit 104C receives a reference voltage REF3, and the power detection circuit 104N receives a reference voltage REFN'. In some embodiments, each power detection circuit receives reference voltage REF1 and another reference voltage that corresponds to that power detection circuit. For example, the power detection circuit 104A receives reference voltages REF1 and REF2, the power detection circuit 104B receives reference voltages REF1 and REF3, the power detection circuit 104C receives reference voltages REF1 and REFN, and the power detection circuit 104N receives reference voltages REF1 and REFN'. In some embodiments, the power detection circuit receives reference currents or any of other various reference signals while remaining within the scope of the present disclosure.

In some embodiments, each power detection circuit of the number of power detection circuits 104 receives a corresponding power supply voltage. For example, the power detection circuit 104A receives a power supply voltage PWR1, the power detection circuit 104B receives a power supply voltage PWR2, the power detection circuit 104C receives a power supply voltage PWR3, and the power detection circuit 104N receives a power supply voltage PWRN. In some embodiments, each power detection circuit of the number of power detection circuits 104 receives the power supply voltage PWR1 and a power supply voltage that corresponds to that power detection circuit. For example, the power detection circuit 104A receives power supply voltages PWR1 and PWR1, the power detection circuit 104B receives power supply voltages PWR1 and PWR2, the power detection circuit 104C receives power supply voltages PWR1 and PWR3, and the power detection circuit 104N receives power supply voltages PWR1 and PWRN. In some embodiments, the power detection circuit receives power supply currents or any of other various power supply signals while remaining within the scope of the present disclosure.

In some embodiments, each power detection circuit of the number of power detection circuits 104 provides a corresponding output voltage. For example, the power detection circuit 104A provides an output voltage OUTPUT1, the power detection circuit 104B provides a reference signal OUTPUT2, the power detection circuit 104C provides a reference signal OUTPUT3, and the power detection circuit 104N provides a reference signal OUTPUTN. Each output voltage can be based on the reference voltage and the power supply voltage. In some embodiments, the power detection circuit provides output currents or any of other various output signals while remaining within the scope of the present disclosure.

In some embodiments, the power detection system 100 includes an output stage 106 coupled to the number of power detection circuits 104. The output stage 106 is adapted to increase a drive strength of an output voltage. The output stage 106 can be adapted to perform a logical AND operation on two or more output voltages. In some embodiments, the output stage 106 provides a power ready voltage POWER_RDY that indicates whether the number of power domains or voltage domains is enabled. In some embodiments, the output stage 106 provides power ready currents or any of other various power ready signals while remaining within the scope of the present disclosure. In some embodiments in which the number of power detection circuits 104 includes one power detection circuit, the output voltage is used to indicate whether the power domain or voltage domain is enabled.

Figure 2:
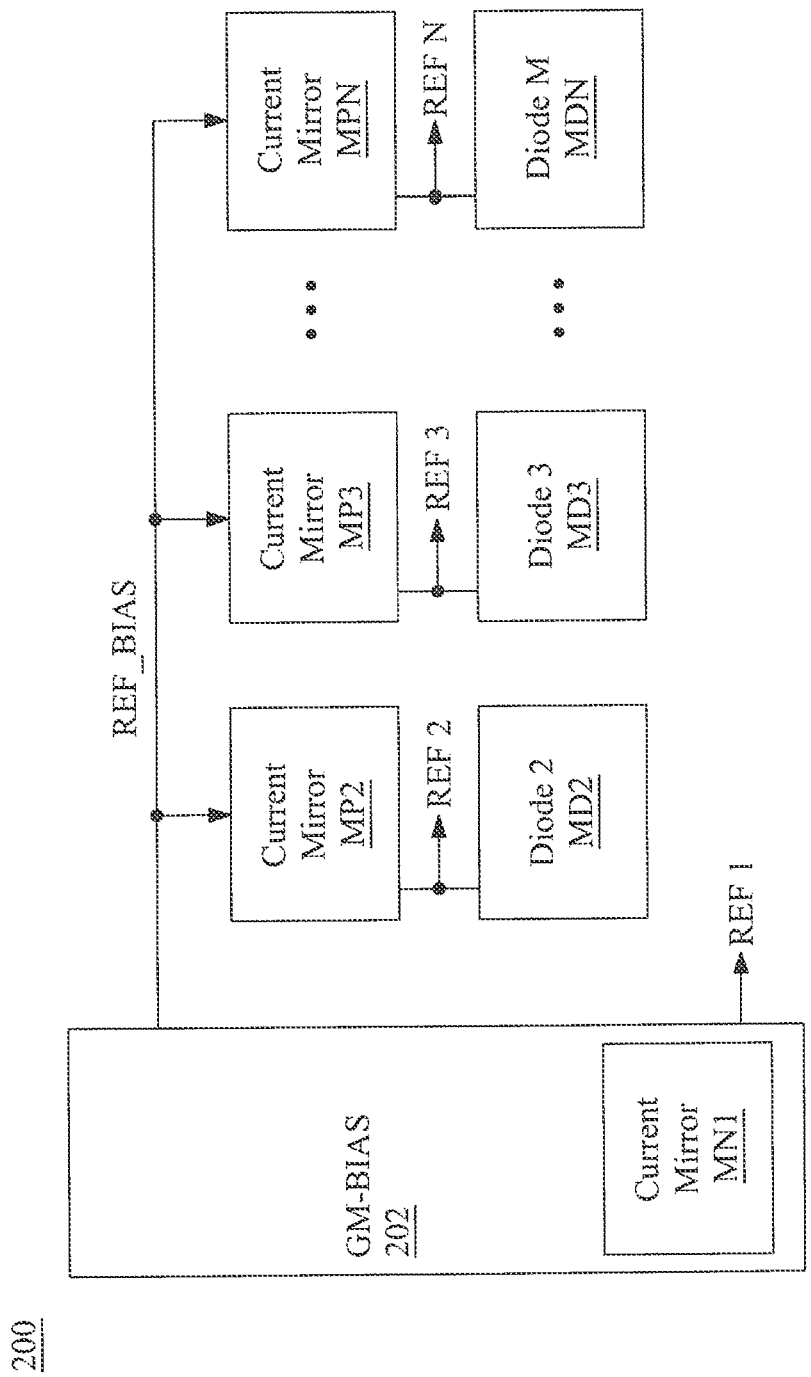
FIG. 2 illustrates a block diagram of a constant-transconductance (gm) reference generator, in accordance with some embodiments of the present disclosure.

FIG. 2 illustrates a block diagram of a constant-gm reference generator 200, in accordance with some embodiments of the present disclosure. The constant-gm reference generator 200 may be same or similar to the constant-gm reference generator 102 of FIG. 1. The constant-gm reference generator 200 includes a gm-bias circuit 202 that generates and provides a reference voltage REF1 via a current mirror MN1. In some embodiments, the constant-gm reference generator 200 includes a number of additional current mirrors that are coupled to the gm-bias circuit 202. For example, the constant-gm reference generator 200 includes a current mirror MP2, a current mirror MP3, and a current mirror MPN. The number of additional current mirrors can include greater than or less than three current mirrors while remaining in the scope of the present disclosure. In some embodiments, each of the number of additional current mirrors is coupled to the gm-bias circuit 202 to receive a reference voltage REF_BIAS.

In some embodiments, each of the number of additional current mirrors provides an additional reference voltage. For example, the current mirror MP2 provides a reference voltage REF2, the current mirror MP3 provides a reference voltage REF3, and the current mirror MPN provides a reference voltage REFN.

In some embodiments, each of the number of additional current mirrors is coupled to a diode. For example, the current mirror MP2 is coupled to the diode MD2, the current mirror MP3 is coupled to the diode MD3, and the current mirror MPN is coupled to the diode MDN. Each diode can be adapted to provide a corresponding reference voltage at a desired voltage level. In some embodiments, each diode can be a programmable set of diodes that are arranged in series or in parallel. By bypassing one or more of the series diodes in the programmable set, or by decoupling one or more of the parallel diodes in the programmable set, the voltage level of the corresponding reference voltage can be changed.

Figures 3A, 3B:
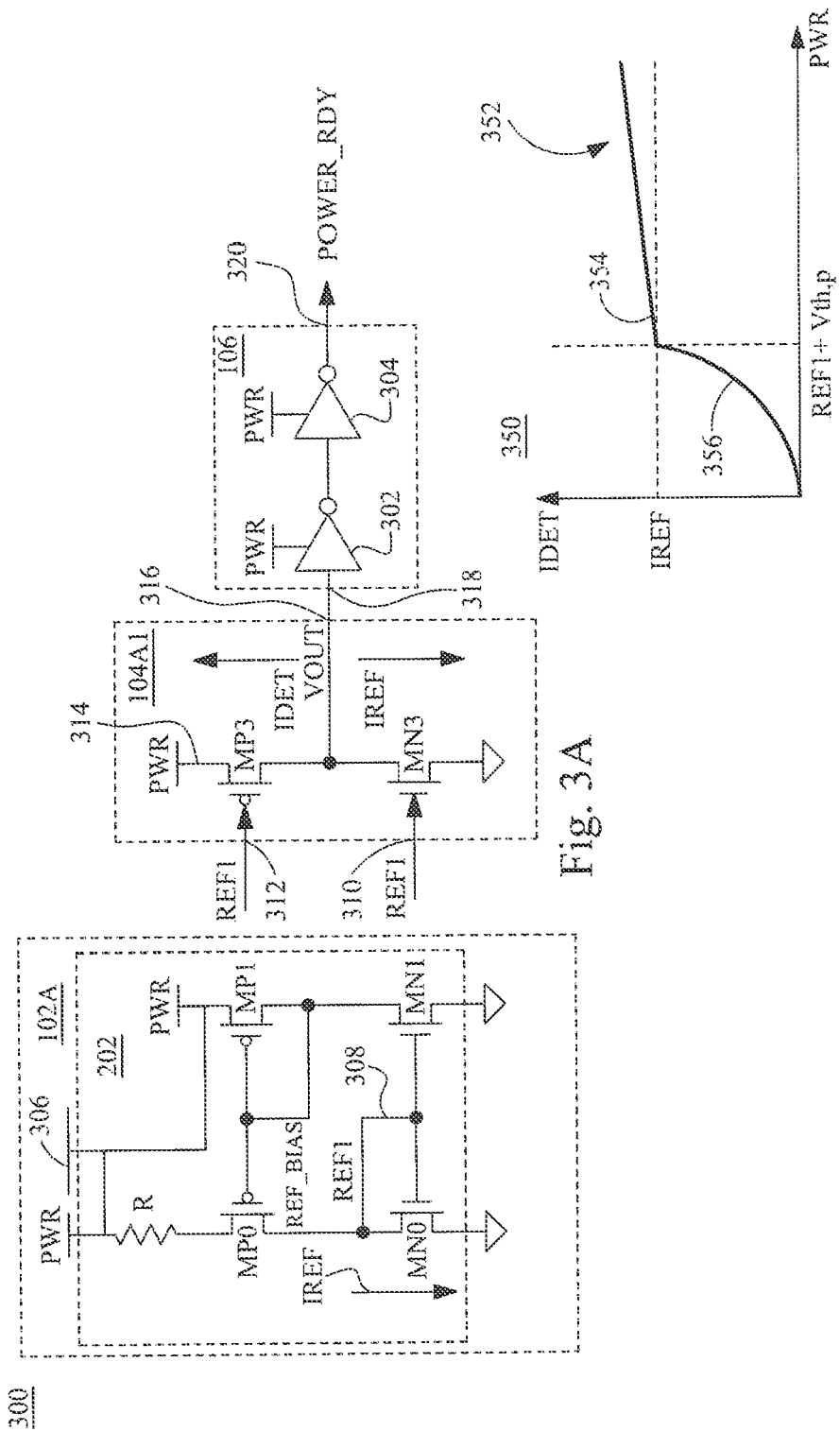
FIG. 3A illustrates a block diagram of a single-reference power detection system, in accordance with some embodiments of the present disclosure.
FIG. 3B illustrates a plot of a current-voltage (IV) curve for a power detection circuit of FIG. 3A, in accordance with some embodiments of the present disclosure.

FIG. 3A illustrates a block diagram of a single-reference power detection system 300, in accordance with some embodiments of the present disclosure. The single-reference power detection system 300 includes the constant-gm reference generator 102A. The constant-gm reference generator 102A may be same or similar to the constant-gm reference generator 102 of FIG. 1. The constant-gm reference generator 102A includes a power supply port 306 and a reference port 308. The constant-gm reference generator 102A includes the gm-bias circuit 202. The gm-bias circuit 202 can include the transistors MP0, MN0, MN1, and MP1 and the resistor R. A first port of the resistor R is coupled to a power supply port 306. The source port of the transistor MP0 is coupled to a second port of the resistor R. The drain port of the transistor MN0 is coupled to the drain port of the transistor MP0 and the reference port 308, and the source port of the transistor MN0 is coupled to ground. The source port of the transistor MP1 is coupled to the power supply port 306 and the gate port of the transistor MP1 is coupled to the gate port of the transistor MP0. The drain port of the transistor MN1 is coupled to the drain port of the transistor MP1, the gate port of the transistor MN1 is coupled to the gate port of the transistor MN0 and the reference port 308, and the source port of the transistor MN1 is coupled to ground. The transistors MN and MP1 are diode-connected. That is, the drain port of MN0 is coupled to the gate port of MN0 and the drain port of MP1 is coupled to the gate port of MP1. The transistor MN1 is a current mirror for the transistor MN. That is, a product of the current IREF and the ratio between MN1 and MN is mirrored from MN0 to MN1.

The ratio of the transistor size of MP to the transistor size of MP1 is M. For example, for a same transistor length, the transistor width of MP0 is M times the transistor width of the transistor MP1. The ratio of the transistor size of MN1 to the transistor size of MN0 is one. For example, for a same transistor length, the transistor width of MN1 is the same as the transistor width of the transistor MN0. The transistor size may be referred to as the transistor area.

In operation, the transistor MN0 receives a current IREF that flows from power supply port 306, through the resistor R, the drain/source ports of the transistor MP0, through the drain/source ports of transistor MN0, to ground. The transistor MN0 provides a reference voltage REF1. The transistor MN1 receives the reference voltage REF1. The transistor MP1 provides a reference voltage REF_BIAS. The transistor MP1 receives the reference voltage REF_BIAS and provides the bias current IREF to transistor MN1. IREF can be proportional to the following:

$$\frac{1}{R^2} \times \left(1 - \frac{1}{\sqrt{M}}\right)^2,$$

where R is a value of the resistor R and M is a ratio of the size of transistor MP0 to the size of transistor MP1. In some embodiments, the R and M are selected such that the single-reference power detection system 300 consumes sub-microamp (sub-uA) of current. Although the current consumption is described with respect to the single-reference power detection system 300, the current consumption can apply to other implementations of the power detection system 100 and the constant-gm reference generator 102 of FIG. 1 without departing from the scope of the present disclosure. In some embodiments, M is selected to be less than four, three, two, or any of other various size ratio values without departing from the scope of the present disclosure. In some embodiments, R is selected to be greater than 500 Kilo-ohms (kohm), 1 Mega-ohm (Mohm), 2 Mohms, or any of other various resistor values without departing from the scope of the present disclosure.

The single-reference power detection system 300 includes a power detection circuit 104A1. The power detection circuit 104A1 may be same or similar to the power detection circuit 104A of FIG. 1. The power detection circuit 104A1 includes a reference port 310 coupled to the reference port 308 to receive the reference voltage REF1, a reference port 312 coupled to the reference port 308 to receive the reference voltage REF1, and a power supply port 314 to receive the power supply voltage PWR. The power detection circuit 104A1 includes a transistor MN3 and a transistor MP3 coupled to the transistor MN3. The gate port of the transistor MN3 is coupled to the reference port 310, the drain port of the transistor MN3 is coupled to the output port 316, and the source port of the transistor MN3 is coupled to ground. The gate port of the transistor MP3 is coupled to the reference port 312, the drain port of the transistor MP3 is coupled to the output port 316, and the source port of the transistor MP3 is coupled to the power supply port 314. In some embodiments, the ratio of the transistor size of MN3 to the transistor size of MN0 is one. For example, for a same transistor length, the transistor width of MN3 is the same as the transistor width of the transistor MN0. The transistor size may be referred to as the transistor area.

In operation, the power detection circuit 104A1 receives the reference voltage REF1 and the power supply voltage PWR. The transistor MN3 generates the current IREF based on the reference voltage REF1. The transistor MP3 generates a current IDET based on the reference voltage REF1. If the power supply voltage PWR is greater than the sum of the reference voltage REF1 and the voltage threshold (Vth) of the transistor MP3, the current IDET is greater than the current IREF. If the power supply voltage PWR is less than the sum of the reference voltage REF1 and the Vth of the transistor MP3, the current IDET is less than the current IREF. The Vth of a transistor can be determined by sweeping the gate voltage of the transistor, measuring the drain/source current of the transistor, and extrapolating the linear portion of the current/voltage (IV) curve of the transistor to determine the voltage at which the extrapolated line crosses the x-axis. The power detection circuit 104A1 provides an output voltage VOUT based on the current IREF and the current IDET. The power detection circuit operates like an inverter. If REF1 is a high voltage such as a voltage with a magnitude equal or substantially equal to a magnitude of a supply voltage PWR, then then MN3 turns on, MP3 turns off, and 316 is coupled to ground, causing a magnitude of VOUT to be equal or substantially equal to a magnitude of a ground voltage (e.g., zero volts). If REF2 is a low voltage such as a voltage with a magnitude equal or substantially equal to a magnitude of a ground voltage, then MN3 turns off, MP3 turns on, and 316 is coupled to 314, causing a magnitude of VOUT to be equal or substantially equal to a magnitude of the supply voltage PWR. Because the output voltage is based on the current IREF and the current IDET, the power detection circuit 104A1 may be referred to as a current detecting methodology, a current sensing methodology, a current sensing power detection circuit, and the like.

FIG. 3B illustrates a plot 350 of a current-voltage (IV) curve 352 for a power detection circuit 104A1 of FIG. 3A, in accordance with some embodiments of the present disclosure. The IV curve 352 is plotted as the current IDET versus the power supply voltage PWR. A first portion 354 of the IV curve 352 shows that when the power supply voltage PWR is greater than a sum of the reference voltage REF1 and the Vth of MP3, then the current IDET is greater than the current IREF. A second portion 356 of the IV curve 352 shows that when the power supply voltage PWR is less than a sum of the reference voltage REF1 and the Vth of MP3, then the current IDET is less than the current IREF.

Referring to FIG. 3A, the single-reference power detection system 300 includes an output stage 106. The output stage 106 may be same or similar to the output stage 106 of FIG. 1. The output stage 106 includes an input voltage port 318 to receive the output voltage provided by the power detection circuit 104A1. The output stage 106 includes a power ready port 320. The output stage 106 includes an inverter 302 and an inverter 304, which are for increasing the drive strength of the single-reference power detection system 300 to be able to send the output signal POWER_RDY to a next stage coupled to the output 320. The input port of the inverter 302 is coupled to the input voltage port 318. The input port of the inverter 304 is coupled to the inverter 302 and the output port of the inverter 304 is coupled to the power ready port 320. The inverters 302 and 304 can be implemented using NMOS transistors and PMOS transistors. The inverters 302 and 304 can be implemented using implementations understood by a person of ordinary skill in the art.

If the current IDET is greater than the current IREF, then the output stage 106 provides a power ready signal in a first logic state (e.g., high, "1"). The first logic state can be a first voltage level such as a voltage level same or similar to a voltage level of power supply voltage PWR. If the current IDET is less than the current IREF, then the output stage 106 provides a power ready signal in a second logic state (e.g., low, "0"). The second logic state can be a second voltage level such as a voltage level same or similar to a voltage level of ground.

FIG. 4A illustrates a block diagram of a multi-reference power detection system 400, in accordance with some embodiments of the present disclosure. In some embodiments, the multi-reference power detection system 400 is similar to the single-reference power detection system 300 of FIG. 3A, and the constant-gm reference generator 102B is similar to the constant-gm reference generator 102A of FIG. 3A, except that the constant-gm reference generator 102B provides two reference voltages to the power detection circuit 104A1. Advantageously, providing two reference voltages enables the multi-reference power detection system 400 to be able to adjust one of the reference voltages independently of the other reference voltage.

The constant-gm reference generator 102B includes a reference port 402, a transistor MP2 and diode MD2. The transistor MP2 is a current mirror for the transistor MP1. In some embodiments, the ratio of the transistor size of MP2 to the transistor size of MP1 is one. The gate of transistor MP2 is coupled to the gate of the transistor MP1, the source of the transistor MP2 receives the power supply voltage PWR, and the drain of the transistor MP2 is coupled to the reference port 402. The anode port of the diode MD2 is coupled to the reference port 402 and the cathode port of the diode MD2 is coupled to ground.

As shown in FIG. 4A, if the power supply voltage PWR is greater than the sum of the reference voltage REF2 and the Vth of the transistor MP3, the current IDET is greater than the current IREF. If the power supply voltage PWR is less than the sum of the reference voltage REF2 and the Vth of the transistor MP3, the current IDET is less than the current IREF.

FIG. 4B illustrates a plot 450 of a current-voltage (IV) curve 452 for a power detection circuit 104A1 of FIG. 4A, in accordance with some embodiments of the present disclosure. The plot 450 is similar to the plot 350 except that the plot 450 shows that the logic state is at least based on the reference voltage REF2, whereas the plot 350 shows that the logic state is at least based on the reference voltage REF1.

Figure 5:
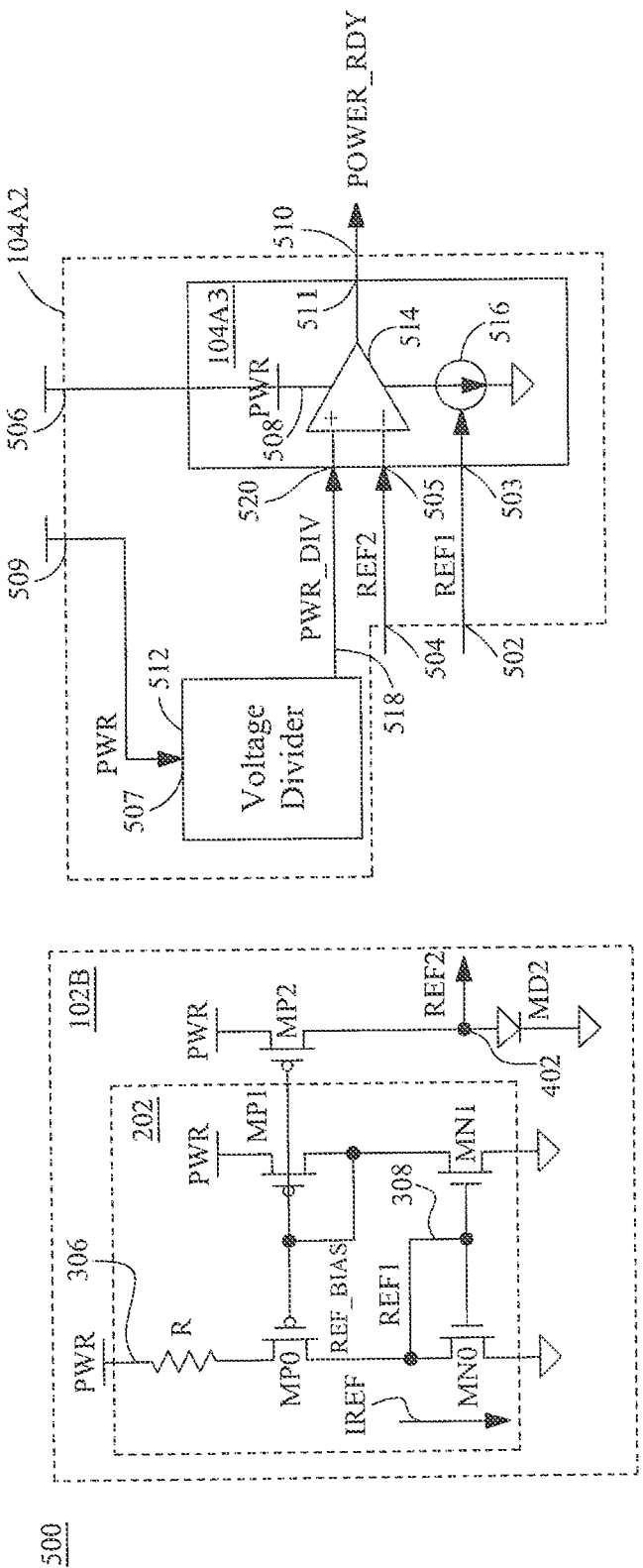
FIG. 5 illustrates a block diagram of a multi-reference power detection system, in accordance with some embodiments of the present disclosure.

FIG. 5 illustrates a block diagram of a multi-reference power detection system 500, in accordance with some embodiments of the present disclosure. In some embodiments, the multi-reference power detection system 500 is similar to the multi-reference power detection system 400 except that the multi-reference power detection system 500 includes a power detection circuit 104A2 that uses a voltage detecting methodology, whereas the power detection circuit 104A1 of the multi-reference power detection system 400 uses a current detecting methodology. Advantageously, using a voltage detecting methodology allows voltage dividing the power supply voltage. Thus, the power detection circuit 104A2 may be suitable for detecting a power supply that outputs a higher voltage level. Another advantage is that the drive strength of an output voltage provided by the power detection circuit 104A2 has a higher drive strength such that the output stage may be omitted. The power detection circuit 104A2 may be same or similar to the power detection circuit 104A of FIG. 1.

The power detection circuit 104A2 includes a reference port 502 that receives the reference voltage REF1, a reference port 504 that receives the reference voltage REF2, a power supply port 506 that receives a power supply voltage PWR, a power supply port 509 that receives a power supply voltage PWR, and an output port 510 that provides an output voltage. In some embodiments, the output voltage is the same as the power ready voltage POWER_RDY that indicates whether the power/voltage domain associated with the power detection circuit 104A2 is enabled. In other words, in some embodiments, there is no output stage.

The power detection circuit 104A2 includes a voltage divider 512. The voltage divider 512 includes an output port 518 and an input port 507 that is coupled to the power supply port 509 of the power detection circuit 104A2. The voltage divider 512 is adapted to receive a voltage at its input port 507, divide the voltage to generate a divided voltage PWR_DIV, and output the divided voltage PWR_DIV at its output port 518. The voltage divider 512 may be implemented as a resistor string between the input port 507 and ground, where the output port 518 is coupled to a node between two of the resistors.

The power detection circuit 104A2 includes a power detection circuit 104A3, which may be referred to as a core power detection circuit or a divider-less power detection circuit. The power detection circuit 104A3 may be same or similar to the power detection circuit 104A of FIG. 1. The power detection circuit 104A3 includes a reference port 503 that is coupled to the reference port 502 of the power detection circuit 104A2, a reference port 505 that is coupled to the reference port 504 of the power detection circuit 104A2, a power supply port 520 that is coupled to the output port 518 of the voltage divider 512, a power supply port 508 that is coupled to the power supply port 506 of the power detection circuit 104A2, and an output port 511 that is coupled to the output port 510 of the power detection circuit 104A2.

The power detection circuit 104A3 includes a comparator 514. The comparator 514 can receive the reference voltage REF2, via the reference port 505, at the inverting input terminal. As shown in FIG. 5, the comparator 514 can receive the divided voltage PWR_DIV, via the power supply port 520, at the non-inverting input terminal. The comparator can be adapted to provide an output signal at the output port 511, via an output terminal of the comparator 514, based on the reference voltage REF2 and the divided voltage PWR_DIV. In response to the divided voltage PWR_DIV being greater than the reference voltage REF2, the output signal is in the first logic state. In response to the divided voltage PWR_DIV being less than the reference voltage REF2, the output signal is in the second logic state. The comparator can be implemented using an operational amplifier. The comparator can be implemented using NMOS transistors and PMOS transistors. The comparator can be implemented using implementations understood by a person of ordinary skill in the art. The comparator 514 can be implemented using any of various circuits without departing from the scope of the present disclosure.

The power detection circuit 104A3 includes a current source 516. The current source 516 is operated to supply a current bias to the comparator 514. The current source 516 can be implemented using a current mirror, such as an NMOS transistor, that receives the reference voltage REF1 and generates a current flowing through the drain/source ports. The current source 516 can be implemented using any of various circuits without departing from the scope of the present disclosure.

Figure 6A:
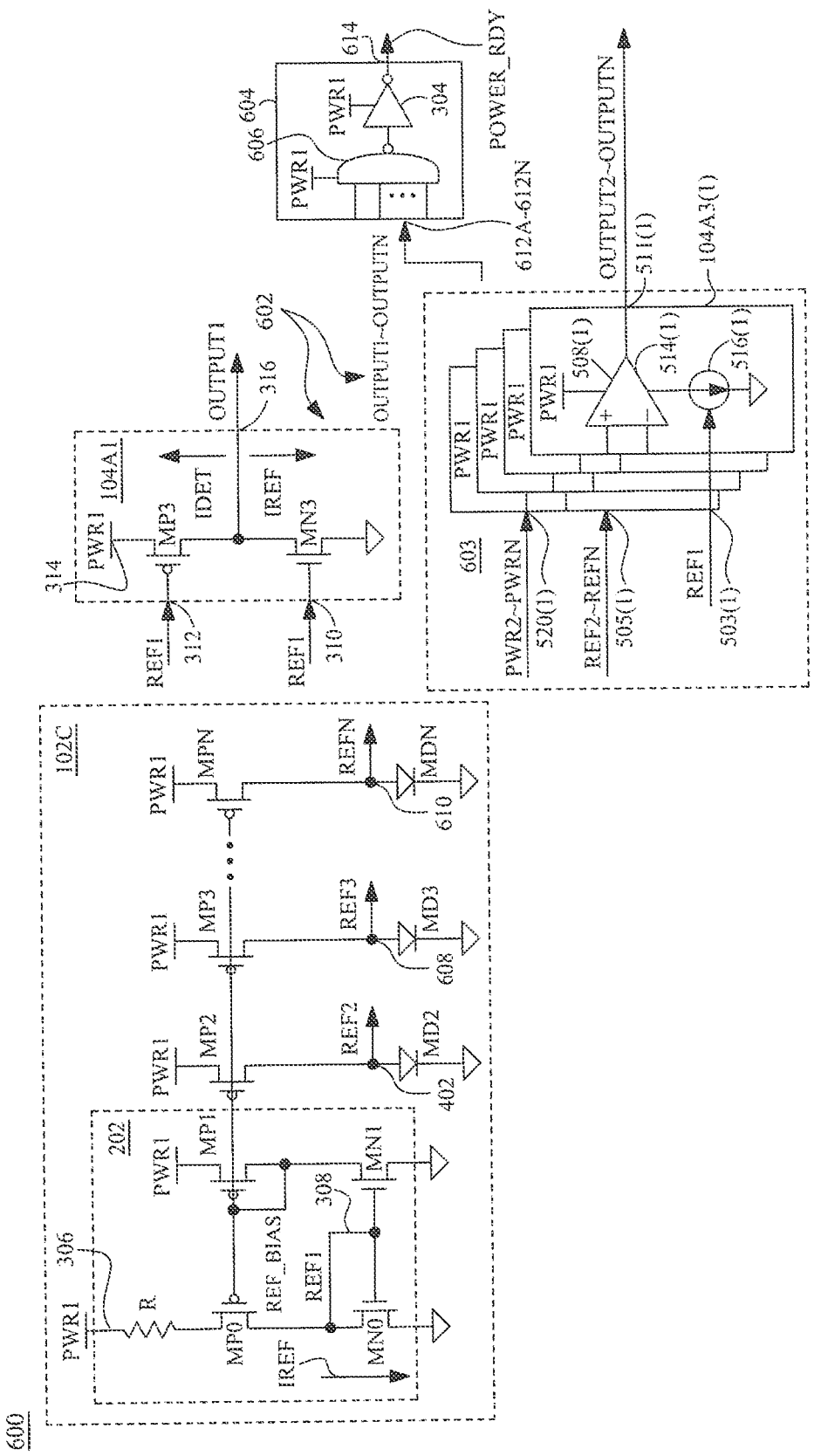
FIG. 6A illustrates a block diagram of a multi-power-domain power detection system, in accordance with some embodiments of the present disclosure.

FIG. 6A illustrates a block diagram of a multi-power-domain power detection system 600, in accordance with some embodiments of the present disclosure. In some embodiments, the multi-power-domain power detection system 600 is similar to the single-reference power detection system 300 of FIG. 3A or the multi-reference power detection system 400 of FIG. 4A except that the multi-power-domain power detection system 600 can independently detect whether separate power domains or voltage domains are enabled. Advantageously, the multi-power-domain power detection system 600 can handle scenarios where one power domain is unexpectedly disabled. In such a scenario, the multi-power-domain power detection system 600 can prevent mis-programming or damage to semiconductor devices by indicating that not all the power domains or voltage domains are enabled, which can thereby trigger a restart process.

The multi-power-domain power detection system 600 includes a constant-gm reference generator 102C. The constant-gm reference generator 102C may be same or similar to the constant-gm reference generator 102 of FIG. 1 and the constant-gm reference generator 200 of FIG. 2. The constant-gm reference generator 102C includes the gm-bias circuit 202 of the constant-gm reference generators 200, 102A, and 102B of FIGS. 2, 3A, 4A, and 5. The constant-gm reference generator 102C includes the reference port 402, the transistor MP2 and the diode MD2 of the constant-gm reference generator 102B of FIGS. 4A and 5.

The constant-gm reference generator 102C includes a number of reference ports such as reference ports 402, 608, and 610, a number of current mirrors such as the transistors MP2, MP3, and MPN, and a number of diodes such as the diodes MD2, MD3, and MDN. Each of the number of reference ports can provide a reference voltage to a power detection circuit associated with a respective power domain. Each of the current mirrors MP2, MP3, and MPN are a current mirror for the transistor MP1. The reference port 608, the transistor MP3 and the diode MD3 are coupled to each other similarly to how the reference port 402, the transistor MP2 and the diode MD2 of FIGS. 4A and 5 are coupled to each other. Likewise, the reference port 610, the transistor MPN and the diode MDN are coupled to each other similarly to how the reference port 402, the transistor MP2 and the diode MD2 of FIGS. 4A and 5 are coupled to each other. Although the constant-gm reference generator 102C shows four current mirrors (MN0, MP2, MP3, and MPN) four reference ports (308, 402, 608, and 610), and four reference voltages (REF1, REF2, REF3, and REFN), the constant-gm reference generator 102C can have greater than or less than four current mirrors, reference ports, and reference voltages while remaining in the scope of the present disclosure.

The multi-power-domain power detection system 600 includes a number of power detection circuits 602. The number of power detection circuits 602 can be same or similar to the number of power detection circuits 104 of FIG. 1. Each power detection circuit of the number of power detection circuits 602 can be associated with a respective power domain or voltage domain.

The number of power detection circuits 602 includes a power detection circuit 104A1. The power detection circuit 104A1 can be same or similar to the power detection circuit 104A of FIG. 1. The power detection circuit 104A1 is same as the power detection circuit 104A1 of FIGS. 3A and 4A. The power detection circuit 104A1 receives the power supply voltage PWR1 at the power supply port 314. The power supply voltage PWR1 of FIG. 6A may be the same as the power supply voltage PWR of FIGS. 3A, 4A, and 5. The power detection circuit 104A1 provides an output signal OUTPUT1 at the output port 316.

In some embodiments, the power detection circuit 104A1 receives the reference voltage REF1 at each of the reference port 310 and the reference port 312, which is similar to the port connections of the power detection circuit 104 with respect to FIG. 3A.

The number of power detection circuits 602 includes a number of power detection circuits 603. The number of power detection circuits 603 includes N−1 power detection circuits, where N is the total number of power domains in the multi-power-domain power detection system 600, and N can be any positive integer value while remaining in the scope of the present disclosure. Each of the N−1 power detection circuits of the number of power detection circuits 603 is same or similar to the power detection circuit 104A3 of FIG. 5. Each of the N−1 power detection circuits of the number of power detection circuits 603 can be same or similar to the power detection circuit 104B of FIG. 1.

The power detection circuit 104A3(1) is an exemplary power detection circuit of the N−1 power detection circuits. The power detection circuit 104A3(1) includes a reference port 503(1) that receives the reference voltage REF1, a reference port 505(1) that receives the reference voltage REF2, a power supply port 520(1) that receives the power supply voltage PWR2, a power supply port 508(1) that receives the power supply voltage PWR1, and an output port 511(1), a comparator 514(1), and a current source 516(1). Unless specified otherwise, each port and component of the power detection circuit 104A3(1) is same as the corresponding port and component of the power detection circuit 104A3 which has the same corresponding reference number except for the "(1)." The constant-gm reference generator 102C generates N reference voltages, and each of the N−1 power detection circuits receive the reference voltage REF1 through their corresponding reference port 503(Y), a reference voltage REF(Y) through their corresponding reference port 505(Y), the power supply voltage PWR1 through their corresponding power supply port 508(Y), and a power supply voltage PWR(Y) through their corresponding power supply port 520(Y), where Y is any number from 2 to N. In some embodiments, a voltage level of the power supply voltage PWR1 is greater than a voltage level of each of the power supply voltage PWR2-PWRN.

The multi-power-domain power detection system 600 includes an output stage 604. The output stage 604 includes input ports 612A, 612B, . . . , 612N. The input port 612A is coupled to the output port 316 of the power detection circuit 104A1 to receive the output voltage OUTPUT1. The input ports 612B-612N are coupled to the output ports 511(1)-511(N-1), respectively, to receive the output voltages OUTPUT2-OUTPUTN, respectively. For example, the input port 612B receives the output signal OUTPUT2, the input port 612C receives the output signal OUTPUT3, the input port 612D receives the output signal OUTPUT4, and the input port 612N receives the output signal OUTPUTN. The output stage 604 includes an output port 614 to provide a power ready voltage POWER_RDY. The output stage 604 includes a NAND gate 606 that performs a NAND operation on each of the output voltages OUTPUT1-OUTPUTN received at each of the respective input ports 612A-612N to generate a first voltage. The NAND gate 606 can be implemented using NMOS transistors and PMOS transistors. The NAND gate 606 can be implemented using implementations understood by a person of ordinary skill in the art. The output stage 604 includes the inverter 304 of FIGS. 3A and 4A coupled to the NAND gate 606 to invert the first voltage to generate the power ready voltage POWER_RDY.

Figure 6B:
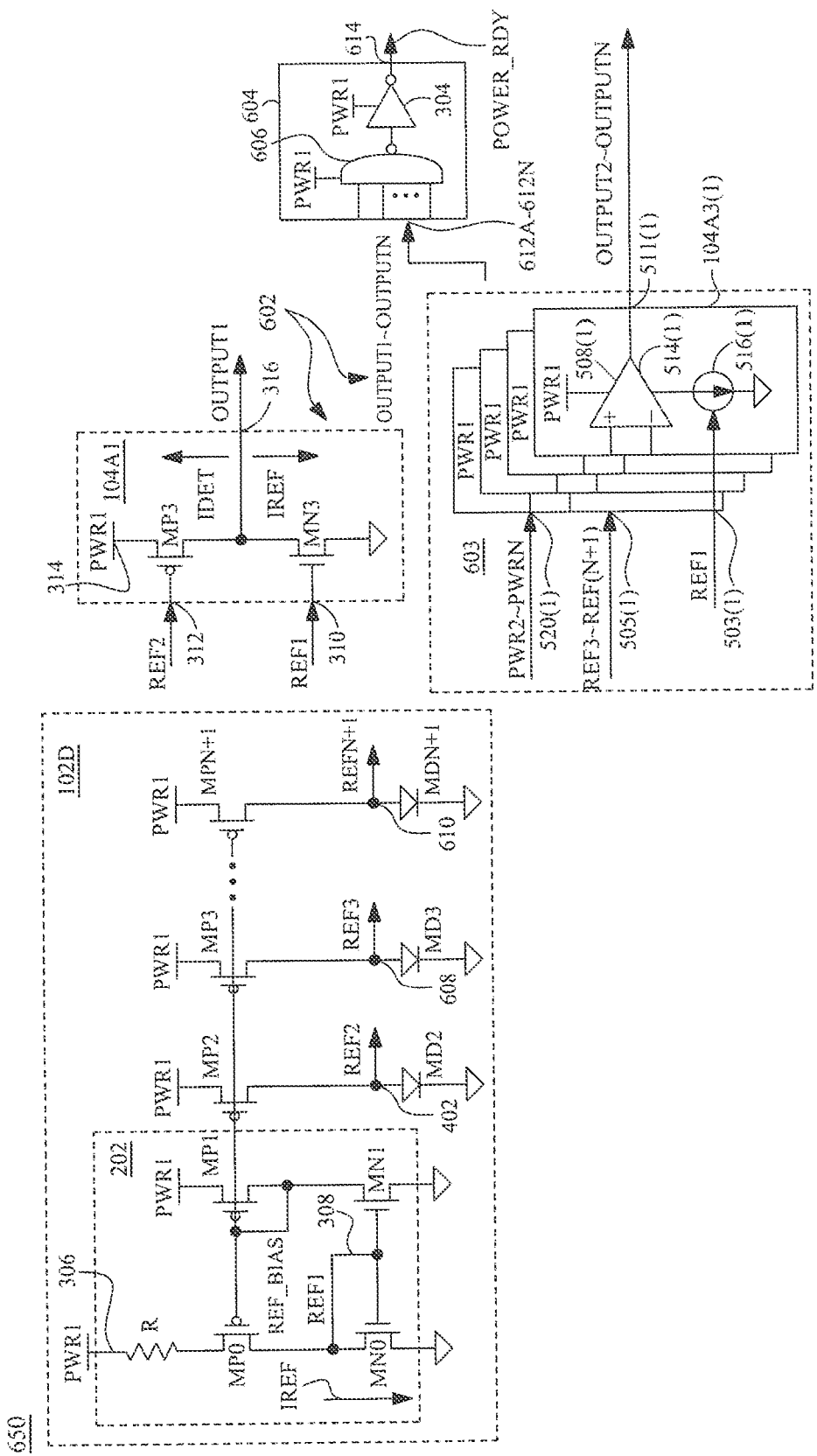
FIG. 6B illustrates a block diagram of a multi-power-domain power detection system, in accordance with some embodiments of the present disclosure.

FIG. 6B illustrates a block diagram of a multi-power-domain power detection system 650, in accordance with some embodiments of the present disclosure. In some embodiments, the multi-power-domain power detection system 650 is similar to the multi-power-domain power detection system 600 of FIG. 6A, and the constant-gm reference generator 102D is same or similar to the constant-gm reference generator 102C of FIG. 6A, except that the constant-gm reference generator 102D provides N+1 reference voltages to the power detection circuit 104A1, where N is the same across FIGS. 6A and 6B. In other words, the constant-gm reference generator 102D provides one more reference voltage to the power detection circuit 104A1 than does the constant-gm reference generator 102C of FIG. 6A. Advantageously, providing N+1 reference voltages enables the multi-power-domain power detection system 650 to be able to adjust one of the reference voltages (REF1) independently of the other reference voltage (REF2) for the power detection circuit 104A1. This may be useful if the manufacturing process of either PMOS transistors or NMOS transistors varies from the expected behavior because the reference voltage REF1 or REF2 can be adjusted to compensate for the variation of the PMOS MP3 or the NMOS MN3, respectively.

The multi-power-domain power detection system 650 includes the constant-gm reference generator 102D. The constant-gm reference generator 102D may be same or similar to the constant-gm reference generator 102 of FIG. 1 and the constant-gm reference generator 200 of FIG. 2. The constant-gm reference generator 102D generates N+1 reference voltages.

The multi-power-domain power detection system 650 includes the power detection circuit 104A1 of FIGS. 3A, 4A, and 6A. The power detection circuit 104A1 of the multi-power-domain power detection system 650 receives the reference voltage REF1 at the reference port 310 and receives the reference voltage REF2 at the reference port 312, which is similar to the port connections of the power detection circuit 104 with respect to FIG. 4A.

The multi-power-domain power detection system 650 includes the number of power detection circuits 603 of FIG. 6A. Each of the N-1 power detection circuits of the number of power detection circuits 603 receives a reference voltage REF(Y+1) through a corresponding reference port 505(Y), where Y is any number from 2 to N. In one example, if N=10, then the power detection circuit 603 of FIG. 6B is operated to receive the reference voltages REF3 to REF11. Assuming still that N=10, this would be different from the power detection circuit 603 of FIG. 6A, which would be operated to receive the reference voltages REF2 to REF10.

Figure 7:
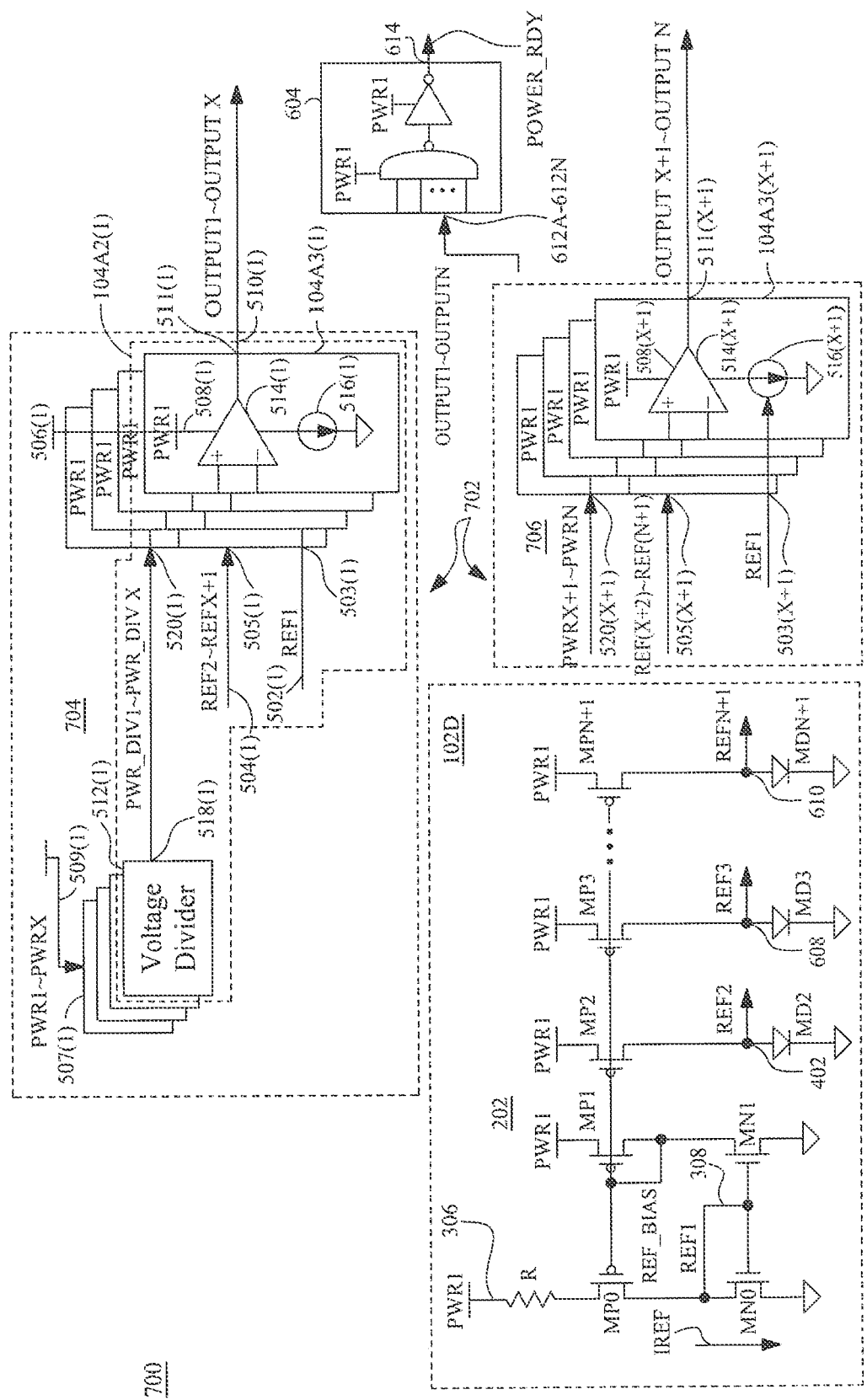
FIG. 7 illustrates a block diagram of a multi-power-domain power detection system, in accordance with some embodiments of the present disclosure.

FIG. 7 illustrates a block diagram of a multi-power-domain power detection system 700, in accordance with some embodiments of the present disclosure. In some embodiments, the multi-power-domain power detection system 700 is similar to the multi-power-domain power detection system 600 of FIG. 6B except that each of the power detection circuits of the multi-power-domain power detection system 700 uses a voltage detecting methodology and at least some of the power detection circuits include voltage dividers. Advantageously, voltage dividers allow for detecting a power supply that outputs a higher voltage level.

The multi-power-domain power detection system 700 includes the constant-gm reference generator 102D of FIG. 6B. This is described in more detail with respect to FIG. 6B.

The multi-power-domain power detection system 700 includes a number of power detection circuits 702. The number of power detection circuits 702 can be same or similar to the number of power detection circuits 104 of FIG. 1. Each power detection circuit of the number of power detection circuits 702 can be associated with a respective power domain or voltage domain.

The number of power detection circuits 702 includes a number of power detection circuits 704. The number of power detection circuits 704 includes X power detection circuits, where X is the number of power detection circuits that include voltage dividers, and X can be any positive integer value while remaining in the scope of the present disclosure. In some embodiments, X is the number of power domains that have voltage levels necessitating a voltage divider. Each of the X power detection circuits of the number of power detection circuits 704 is same or similar to the power detection circuit 104A2 of FIG. 5. Each of the X power detection circuits of the number of power detection circuits 704 can be same or similar to the power detection circuit 104A of FIG. 1.

The power detection circuit 104A2(1) is an exemplary power detection circuit of the X power detection circuits. The power detection circuit 104A2(1) includes a reference port 502(1) that receives the reference voltage REF1, a reference port 504(1) that receives the reference voltage REF2, a power supply port 509(1) that receives the power supply voltage PWR1, a power supply port 506(1) that receives the power supply voltage PWR1, and an output port 510(1), a voltage divider 512(1) and a power detection circuit 104A3(1). Unless specified otherwise, each port and component of the power detection circuit 104A2(1) is same as the corresponding port and component of the power detection circuit 104A2 of FIG. 5, which has the same corresponding reference number except for the "(1)."

The voltage divider 512(1) includes the input port 507(1) and the output port 518(1). Unless specified otherwise, each port and component of the voltage divider 512(1) is same as the corresponding port and component of the voltage divider 512 of FIG. 5, which has the same corresponding reference number except for the "(1)." The power detection circuit 104A3(1) is same or similar to the power detection circuit 104A3(1) of FIG. 6A.

Each of the X power detection circuits of the number of power detection circuits 704 receive the reference voltage REF1 through their corresponding reference port 502(V), a reference voltage REF(V+1) through their corresponding reference port 504(V), the power supply voltage PWR1 through their corresponding power supply port 506(V), and a power supply voltage PWR(V) through their corresponding power supply port 509(V), where V is any number from 1 to X.

The number of power detection circuits 702 includes a number of power detection circuits 706. The number of power detection circuits 704 includes N-X power detection circuits, where N is the total number of power domains, and N can be any positive integer value greater than X while remaining in the scope of the present disclosure. Each of the N-X power detection circuits of the number of power detection circuits 706 is same or similar to the power detection circuit 104A3 of FIGS. 5, 6A, and 6B. Each of the N-X power detection circuits of the number of power detection circuits 706 can be same or similar to the power detection circuit 104B of FIG. 1.

The power detection circuit 104A3(X+1) is an exemplary power detection circuit of the N-X power detection circuits. The power detection circuit 104A3(X+1) includes a reference port 503(X+1) that receives the reference voltage REF1, a reference port 505(X+1) that receives the reference voltage REF(X+2), a power supply port 520(X+1) that receives the power supply voltage PWR(X+1), a power supply port 508(X+1) that receives the power supply voltage PWR1, and an output port 511(X+1), a comparator 514(X+1), and a current source 516(X+1). Unless specified otherwise, each port and component of the power detection circuit 104A3(X+1) is same as the corresponding port and component of the power detection circuit 104A3 which has the same corresponding reference number except for the "(X+1)." Each of the N-X power detection circuits receive the reference voltage REF1 through their corresponding reference port 503(Z), a reference voltage REF(Z+1) through their corresponding reference port 505(Z), the power supply voltage PWR1 through their corresponding power supply port 508(Z), and a power supply voltage PWR(Z) through their corresponding power supply port 520(Z), where Z is any number from X+1 to N. In some embodiments, a voltage level of each of the power supply voltages PWR1-PWRX is greater than a voltage level of each of the power supply voltage PWR(X+1)-PWRN.

The multi-power-domain power detection system 700 includes the output stage 604 of FIG. 6A. The input ports 612A-612X are coupled to the output ports 511(1)-511(X) to receive the output voltages OUTPUT1-OUTPUTX, respectively, and the input ports 612(X+1)-612N are coupled to the output ports 511(X+1)-511(N) to receive the output voltages OUTPUT(X+1)-OUTPUTN.

Although FIGS. 6A, 6B, and 7 illustrate some combinations of power detection circuits, other combinations of power detection circuits are within the scope of the present disclosure. For example, a power detection system can include multiple instances of the power detection circuit 104A1 in combination with either multiple instances of the power detection circuit 104A2, multiple instances of the power detection circuit 104A3, or both.

Figure 8:
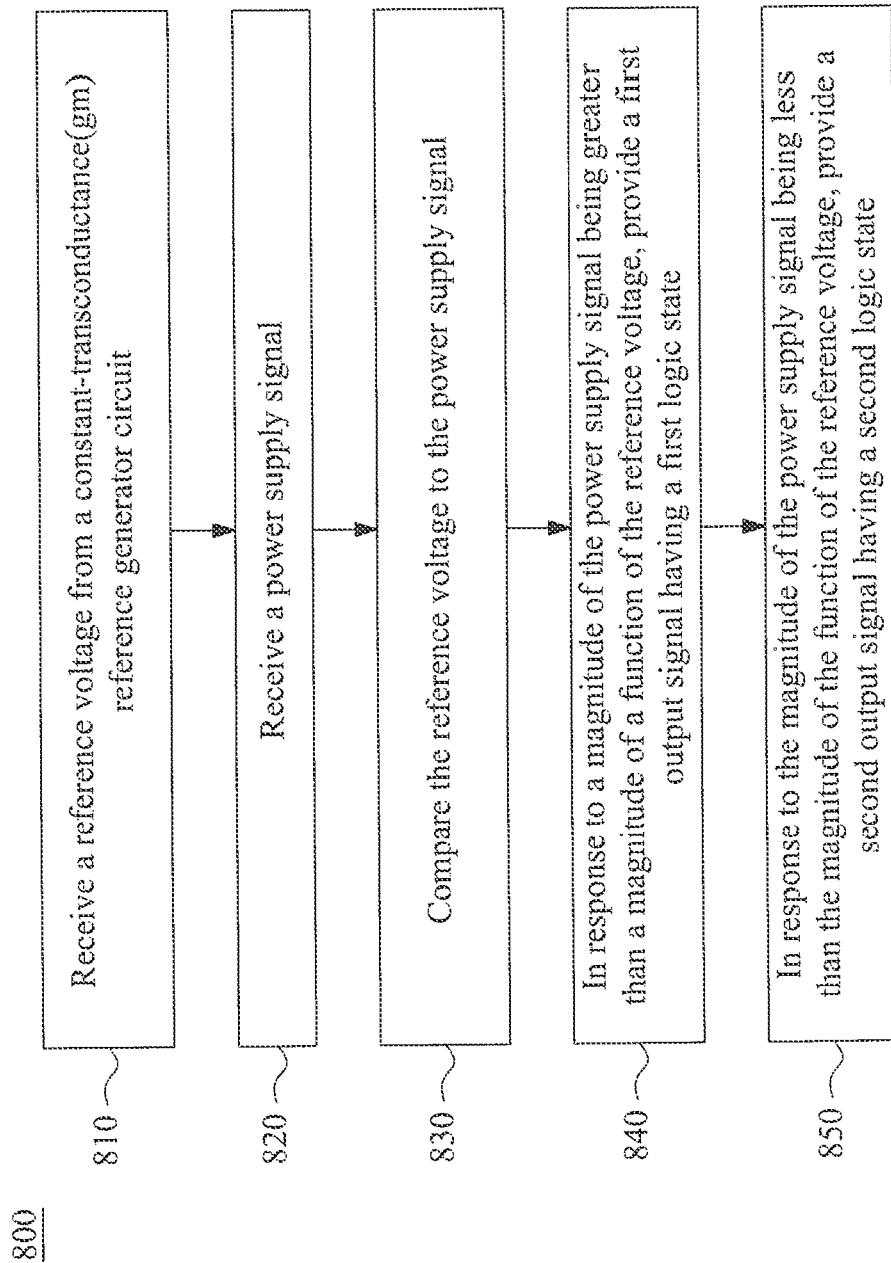
FIG. 8 illustrates a flowchart of a method to operate power detection, in accordance with some embodiments of the present disclosure.

FIG. 8 illustrates a flowchart of a method 800 to operate power detection, in accordance with some embodiments of the present disclosure. It is noted that the method 800 is merely an example and is not intended to limit the present disclosure. Accordingly, it is understood that additional operations may be provided before, during, and after the method 800 of FIG. 8, and that some other operations may only be briefly described herein. In some embodiments, the method 800 is performed by the power detection system 100, the power detection system 300, the power detection system 400, the power detection system 500, the power detection system 600, the power detection system 650, or the power detection system 700.

At operation 810, the power detection system (e.g., the power detection circuit 104A1 of the power detection system 400 or the power detection circuit 104A2 of the power detection system 500) receives a reference voltage (e.g., the reference voltage REF2) from a constant-transconductance (gm) reference generator circuit (e.g., the constant-gm reference generator circuit 102B). At operation 820, the power detection system receives a power supply signal (e.g., PWR via the power supply port 314). At operation 830, the power detection system compares the reference voltage to the power supply signal. At operation 840, in response to a magnitude of the power supply signal being greater than a magnitude of a function of the reference voltage, the power detection system provides a first output signal (e.g., the output voltage VOUT or the power ready voltage POWER_RDY) having a first logic state. At operation 850, in response to the magnitude of the power supply signal being less than the magnitude of the function of the reference voltage, the power detection system provides a second output signal (e.g., the output voltage VOUT or the power ready voltage POWER_RDY) having a second logic state.

In some embodiments, in response to the magnitude of the power supply signal being greater than a sum of a magnitude of the reference voltage and a magnitude of a transistor threshold voltage, the power detection system (e.g., the power detection circuit 104A1 of the power detection system 400) provides the first output signal having the first logic state. In some embodiments, in response to the magnitude of the power supply signal being less than the sum of the magnitude of the reference voltage and the magnitude of the transistor threshold voltage, the power detection system provides the second output signal having the second logic state.

In some embodiments, in response to the magnitude of the power supply signal being greater than a product of a magnitude of the reference voltage and a voltage divider ratio, the power detection system (e.g., the power detection circuit 104A2 of the power detection system 500) provides the first output signal having the first logic state. In some embodiments, in response to the magnitude of the power supply signal being less than the product of the magnitude of the reference voltage and the voltage divider ratio, the power detection system provides the second output signal having the second logic state.

In some aspects of the present disclosure, a power detection system is disclosed. In some aspects, the power detection system includes a constant-transconductance (gm) reference generator circuit receiving a power supply voltage. In some embodiments, the constant-gm reference generator circuit includes a first current mirror to provide a first reference voltage and a second current mirror to provide a second reference voltage. In some embodiments, the constant-gm reference generator circuit includes a power detection circuit coupled to the first current mirror to receive the first reference voltage. In some embodiments, the power detection circuit is coupled to the second current mirror to receive the second reference voltage. In some embodiments, the power detection is operated to receive the power supply voltage. In some embodiments, the power detection circuit is operated to provide an output voltage having one of two logic states at least based on the second reference voltage and the power supply voltage.

In some embodiments, the power detection circuit includes an N-type metal-oxide-semiconductor (NMOS) transistor and a P-type metal-oxide-semiconductor (PMOS) transistor coupled to the NMOS transistor. In some embodiments, the NMOS transistor is coupled to the first current mirror and the PMOS transistor is coupled to the second current mirror.

In some embodiments, the power detection circuit includes a comparator and a current source. In some embodiments, the current source is coupled to the first current mirror and the comparator is coupled to the second current mirror. In some embodiments, the comparator receives the power supply voltage. In some embodiments, the power detection circuit includes a voltage divider receiving the power supply voltage, and the comparator is coupled to an output port of the voltage divider.

In some embodiments, the power detection system includes a second power detection circuit. In some embodiments, the constant-gm reference generator circuit further comprises a third current mirror. In some embodiments, the second power detection circuit is coupled to the first current mirror to receive the first reference voltage. In some embodiments, the second power detection circuit is coupled to the third current mirror to receive a third reference voltage. In some embodiments, the second power detection circuit receives a second power supply voltage. In some embodiments, the second power detection circuit provides a second output voltage having one of two logic states at least based on third reference voltage and the second power supply voltage.

In some embodiments, a magnitude of the second power supply voltage is less than a magnitude of the power supply voltage. In some embodiments, the second power detection circuit includes an N-type metal-oxide-semiconductor (NMOS) transistor and a P-type metal-oxide-semiconductor (PMOS) transistor coupled to the NMOS transistor, wherein the NMOS transistor is coupled to the first current mirror and the PMOS transistor is coupled to the third current mirror.

In some embodiments, the second power detection circuit includes a second comparator and a second current source. In some embodiments, the second current source is coupled to the first current mirror and the second comparator is coupled to the third current mirror. In some embodiments, the second power detection circuit comprises a voltage divider receiving the power supply voltage, and the second comparator is coupled to the voltage divider.

In some embodiments, the power detection system includes an output stage coupled to the power detection circuit to receive the output voltage from the power detection circuit and provide a power ready voltage. In some embodiments, the output stage includes a first inverter and a second inverter coupled to the first inverter. In some embodiments, the output stage includes a NAND gate and an inverter coupled to the NAND gate.

In some embodiments, the power detection system consumes less than a 1 uA of direct current. In some embodiments, the constant-gm reference generator circuit includes a diode-connected P-type metal-oxide-semiconductor (PMOS) transistor and a current-mirror PMOS transistor coupled to the diode-connected PMOS transistor. In some embodiments, a ratio of the current-mirror PMOS to the diode-connected PMOS is less than four.

In some aspects of the present disclosure, a power detection system is disclosed. In some aspects, the power detection system includes a constant-transconductance (gm) circuit receiving a power supply voltage and providing a reference voltage and a power detection circuit coupled to the constant-gm reference generator circuit. In some embodiments, the power detection circuit is operated to receive the reference voltage. In some embodiments, the power detection circuit is operated to receive the power supply voltage. In some embodiments, the power detection is operated to provide an output signal having one of two logic states at least based on the reference voltage and the power supply voltage. In some embodiments, the power detection system includes an output stage coupled to the power detection circuit to receive the output signal from the power detection circuit and provide a power ready signal.

In some embodiments, the power detection circuit includes an N-type metal-oxide-semiconductor (NMOS) transistor and a P-type metal-oxide-semiconductor (PMOS) transistor coupled to the NMOS transistor. In some embodiments, the NMOS transistor and the PMOS transistor receive the reference voltage.

In some aspects of the present disclosure, a method for power detection is disclosed. In some aspects, the method for power detection includes receiving a reference voltage from a constant-transconductance (gm) reference generator circuit, receiving a power supply signal, comparing the reference voltage to the power supply signal, in response to a magnitude of the power supply signal being greater than a magnitude of a function of the reference voltage, providing a first output signal having a first logic state, and, in response to the magnitude of the power supply signal being less than the magnitude of the function of the reference voltage, providing a second output signal having a second logic state.

In some embodiments, the method includes, in response to the magnitude of the power supply signal being greater than a sum of a magnitude of the reference voltage and a magnitude of a transistor threshold voltage, providing the first output signal having the first logic state, and, in response to the magnitude of the power supply signal being less than the sum of the magnitude of the reference voltage and the magnitude of the transistor threshold voltage, providing the second output signal having the second logic state.

In some embodiments, the method includes, in response to the magnitude of the power supply signal being greater than a product of a magnitude of the reference voltage and a voltage divider ratio, providing the first output signal having the first logic state, and, in response to the magnitude of the power supply signal being less than the product of the magnitude of the reference voltage and the voltage divider ratio, providing the second output signal having the second logic state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A power detection system comprising:
   a constant-transconductance (gm) reference generator circuit receiving a power supply voltage, wherein the constant-gm reference generator circuit comprises a first current mirror to provide a first reference voltage and a second current mirror to provide a second reference voltage;
   a power detection circuit coupled to the first current mirror to receive the first reference voltage, wherein the power detection circuit is coupled to the second current mirror to receive the second reference voltage, wherein the power detection circuit is operated to receive the power supply voltage, wherein the power detection circuit is operated to provide an output voltage having one of two logic states at least based on the second reference voltage and the power supply voltage; and
   a second power detection circuit, wherein the constant-gm reference generator circuit further comprises a third current mirror, wherein the second power detection circuit is coupled to the first current mirror to receive the first reference voltage, wherein the second power detection circuit is coupled to the third current mirror to receive a third reference voltage, wherein the second power detection circuit receives a second power supply voltage, wherein the second power detection circuit provides a second output voltage having one of two logic states at least based on third reference voltage and the second power supply voltage.

2. The power detection system of claim 1, wherein the power detection circuit comprises an N-type metal-oxide-semiconductor (NMOS) transistor and a P-type metal-oxide-semiconductor (PMOS) transistor coupled to the NMOS transistor, wherein the NMOS transistor is coupled to the first current mirror and the PMOS transistor is coupled to the second current mirror.

3. The power detection system of claim 1, wherein the power detection circuit comprises a comparator and a current source, wherein the current source is coupled to the first current mirror and the comparator is coupled to the second current mirror.

4. The power detection system of claim 3, wherein the comparator receives the power supply voltage.

5. The power detection system of claim 3, wherein the power detection circuit comprises a voltage divider receiving the power supply voltage, and the comparator is coupled to an output port of the voltage divider.

6. The power detection system of claim 1, further comprising a second power detection circuit, wherein the constant-gm reference generator circuit further comprises a third current mirror, wherein the second power detection circuit is coupled to the first current mirror to receive the first reference voltage, wherein the second power detection circuit is coupled to the third current mirror to receive a third reference voltage, wherein the second power detection circuit receives a second power supply voltage, wherein the second power detection circuit provides a second output voltage having one of two logic states at least based on third reference voltage and the second power supply voltage.

7. The power detection system of claim 1, wherein a magnitude of the second power supply voltage is less than a magnitude of the power supply voltage.

8. The power detection system of claim 1, wherein the second power detection circuit comprises an N-type metal-oxide-semiconductor (NMOS) transistor and a P-type metal-oxide-semiconductor (PMOS) transistor coupled to the NMOS transistor, wherein the NMOS transistor is coupled to the first current mirror and the PMOS transistor is coupled to the third current mirror.

9. The power detection system of claim 1, wherein the second power detection circuit comprises a second comparator and a second current source, wherein the second current source is coupled to the first current mirror and the second comparator is coupled to the third current mirror.

10. The power detection system of claim 9, wherein the second power detection circuit comprises a voltage divider receiving the power supply voltage, and the second comparator is coupled to the voltage divider.

11. The power detection system of claim 1, further comprising an output stage coupled to the power detection circuit to receive the output voltage from the power detection circuit and provide a power ready voltage.

12. The power detection system of claim 11, wherein the output stage comprises a first inverter and a second inverter coupled to the first inverter.

13. The power detection system of claim 11, wherein the output stage comprises a NAND gate and an inverter coupled to the NAND gate.

14. The power detection system of claim 1, wherein the power detection system consumes less than a 1 uA of direct current.

15. The power detection system of claim 14, wherein the constant-gm reference generator circuit comprises a diode-connected P-type metal-oxide-semiconductor (PMOS) transistor and a current-mirror PMOS transistor coupled to the diode-connected PMOS transistor, wherein a ratio of the current-mirror PMOS to the diode-connected PMOS is less than four.

16. A method for power detection comprising:
   receiving a reference voltage from a constant-transconductance (gm) reference generator circuit;
   receiving a power supply signal;
   comparing the reference voltage to the power supply signal;
   in response to a magnitude of the power supply signal being greater than a magnitude of a function of the reference voltage, providing a first output signal having a first logic state;
   in response to the magnitude of the power supply signal being less than the magnitude of the function of the reference voltage, providing a second output signal having a second logic state;
   in response to the magnitude of the power supply signal being greater than a sum of a magnitude of the reference voltage and a magnitude of a transistor threshold voltage, providing the first output signal having the first logic state; and
   in response to the magnitude of the power supply signal being less than the sum of the magnitude of the reference voltage and the magnitude of the transistor threshold voltage, providing the second output signal having the second logic state.

17. The method of claim 16, further comprising:
   in response to the magnitude of the power supply signal being greater than a product of a magnitude of the reference voltage and a voltage divider ratio, providing the first output signal having the first logic state; and
   in response to the magnitude of the power supply signal being less than the product of the magnitude of the reference voltage and the voltage divider ratio, providing the second output signal having the second logic state.

* * * * *